(12) United States Patent
Hsieh et al.

(10) Patent No.: US 6,864,586 B2
(45) Date of Patent: Mar. 8, 2005

(54) PADLESS HIGH DENSITY CIRCUIT BOARD

(75) Inventors: Han-Kun Hsieh, Miaoli (TW);
Wei-Feng Lin, Hsinchu (TW)

(73) Assignee: Silicon Integrated Systems Corp., Hsin Chu (TW)

( * ) Notice: Subject to any disclaimer, the term of this patent is extended or adjusted under 35 U.S.C. 154(b) by 0 days.

(21) Appl. No.: 10/375,079

(22) Filed: Feb. 28, 2003

(65) Prior Publication Data

US 2004/0169288 A1 Sep. 2, 2004

(51) Int. Cl.$^7$ ............................................. H01L 23/48
(52) U.S. Cl. .................. 257/780; 257/738; 257/734; 257/693; 257/778; 257/775; 257/773
(58) Field of Search ................ 257/668, 738, 257/737, 734, 693, 692, 778, 775, 773, 780

(56) References Cited

U.S. PATENT DOCUMENTS

| | | | | |
|---|---|---|---|---|
| 5,316,799 A | * | 5/1994 | Brunken et al. ............ 427/421 |
| 5,766,492 A | * | 6/1998 | Sadahisa et al. ............... 216/16 |
| 6,443,351 B1 | * | 9/2002 | Huang et al. ................ 228/103 |
| 6,444,561 B1 | * | 9/2002 | Wang et al. ................ 438/612 |
| 6,506,978 B1 | * | 1/2003 | Furihata .................... 174/254 |
| 6,543,128 B2 | * | 4/2003 | Huang et al. ................. 29/841 |
| 6,586,682 B2 | * | 7/2003 | Strandberg .................. 174/255 |

* cited by examiner

Primary Examiner—Nathan J. Flynn
Assistant Examiner—Remmon R. Fordé
(74) Attorney, Agent, or Firm—Birch, Stewart, Kolasch, & Birch, LLP.

(57) ABSTRACT

A padless high density circuit board and manufacturing method thereof. The method includes providing a circuit board substrate, forming external wiring, having a plurality of external terminals with a width as large as or less than the external wiring on the circuit board substrate, forming a solder mask over the circuit board substrate and the external wiring with a plurality of solder mask openings exposing the external terminals, with diameters at least as large as the widths of the external terminals exposed thereby, and forming a plurality of conductive bumps on the external terminals exposed by the solder mask openings for connection with an external device in a subsequent assembly process.

19 Claims, 6 Drawing Sheets

PADLESS HIGH DENSITY CIRCUIT BOARD

BACKGROUND OF THE INVENTION

1. Field of the Invention

The present invention relates to a padless high density circuit board and a manufacturing method thereof, and more specifically to a padless high density circuit board for assembling an electronic product and a manufacturing method thereof.

2. Description of the Related Art

Due to the demand for small-aspect, light and powerful electronic products, it is necessary for a design rule of a circuit board includes, for example, a substrate for a flip chip, BGA, or other kinds of assembly or a printed circuit board (PCB) to assemble an IC package, a light-emitting device, a connector, a passive device, another one circuit board, or other kinds of device, to lay out denser wiring in a limited area of the circuit board. The design rule for external wiring terminal is a major factor limiting wiring density of the circuit board.

In FIG. 1, a conventional substrate 100 for flip chip assembly, for example, shows how the design rule for the external wiring terminal limits wiring density of the circuit board. Bonding pad 112 is an external terminal of external wiring 110. $R_1$, the diameter of bonding pad 112, is as about two to ten times W, the line width of trace line 114 of external wiring 110. Line pitch of external wiring 110, a distance between two neighboring trace lines 114, is limited by the diameter of bonding pad 112. To stay free of short circuits in external wiring 110, it is necessary that the distance between two neighboring trace lines 114 be larger than half $(W+R_1)$, not negatively affecting the design of wiring for a circuit board with a line pitch larger than 180 μm, but that of wiring for a circuit board, such as external wiring 110 of substrate 100 for flip chip assembly, with a line pitch as large as 180 μm, resulting from a bump pitch of an IC chip (not shown) predetermined to attach to substrate 100 being usually as large as 180 μm or below. The design of external wiring 110 is usually limited by the diameter of bonding pad 112, resulting in increased wiring layers or area of substrate 100 to involve all the necessary wiring, resulting from the negative to shrink the distance between two neighboring trace lines 114. Thickness, area, and manufacturing cost of substrate 100 are therefore increased, and the aspect and weight of a final product using substrate 100 are also negatively affected. The design of wiring for other kinds of circuit board includes, for example, a substrate for BGA or other kinds of assembly, or a PCB to assemble an IC package, a light-emitting device, a connector, a passive device, another one circuit board, or other kinds of device, faces the same problem as external wiring 110 of substrate 100.

SUMMARY OF THE INVENTION

Thus, the main object of the present invention is to provide a padless high density circuit board allowing more wiring to be involved in a circuit layer of the circuit board with a limited area and limited numbers of circuit layers, thereby reducing the thickness, area, and manufacturing cost of the circuit board and help to shrink the aspect and weight of a final product using the circuit board.

Another object of the present invention is to provide a manufacturing method for a padless high density circuit board allowing denser wiring to be involved in wiring layer of the circuit board with a limited area and limited numbers of wiring layers, thereby reducing the thickness, area, and manufacturing cost of the circuit board and assist in shrinking the aspect and weight of a final product using the circuit board.

In order to achieve the above objects, the present invention provides a padless high density circuit board, comprising a circuit board substrate, external wiring having a plurality of external terminals with a width as large as or less than the external wiring, formed on the circuit board substrate, a solder mask over the circuit board substrate and the external wiring with a plurality of solder mask openings exposing the external terminals, with diameters at least as large as the widths of the external terminals exposed thereby, and a plurality of conductive bumps formed on the external terminals exposed by the solder mask openings for connection with an external device in a subsequent assembly process.

The present invention further provides a manufacturing method for a padless high density circuit board. First, a circuit board substrate having a dielectric layer on a surface is provided. Then, external wiring, having a plurality of external terminals with a width as large as or less than the external wiring is formed on the dielectric layer. Next, a solder mask is formed over the dielectric layer and the external wiring with a plurality of solder mask openings exposing the external terminals, with diameters at least as large as the widths of the external terminals exposed thereby. Finally, a plurality of conductive bumps is formed on the external terminals exposed by the solder mask openings for connection with an external device in a subsequent assembly process.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

The following embodiments are intended to illustrate the invention more fully without limiting their scope, since numerous modifications and variations will be apparent to those skilled in this art.

First Embodiment

Figure 2A:
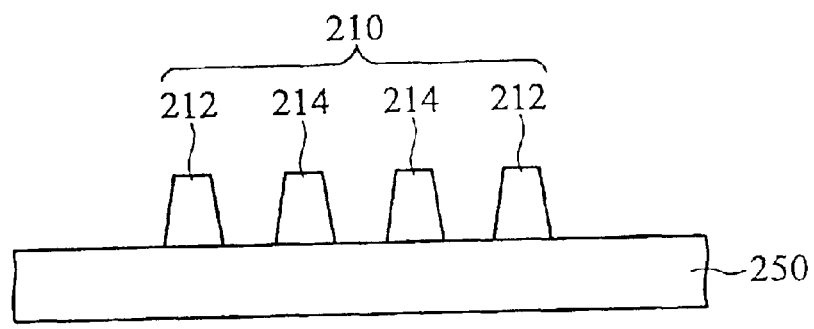
FIGS. 2A through 2C are cross-sections illustrating a padless high density circuit board for a flip chip assembly substrate and manufacturing steps thereof in accordance with the first embodiment of the present invention.
Figure 2B:
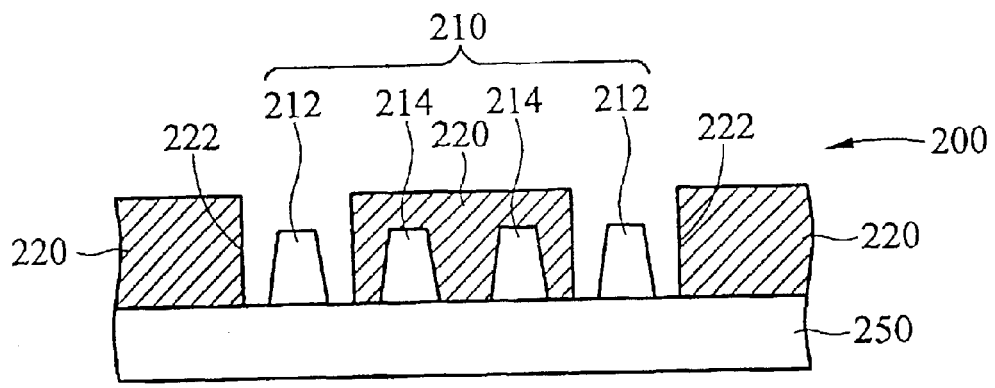
Figure 2C:
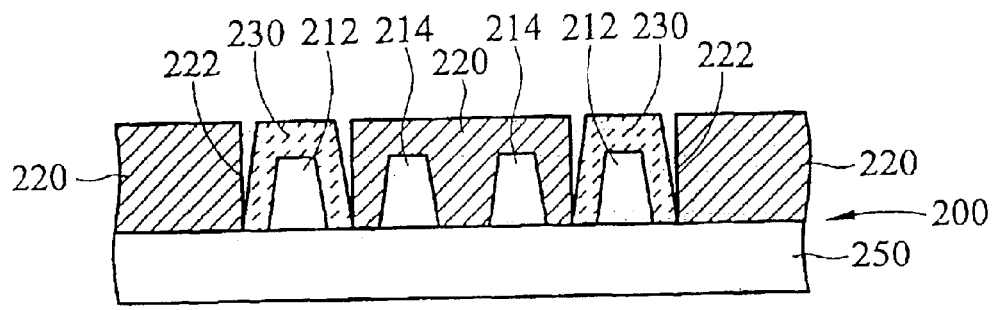

FIGS. 2A through 2C are cross-sections illustrating a padless high density circuit board for a flip chip assembly substrate and manufacturing steps therefor in accordance with the first embodiment of the present invention. The present invention increases the wiring density of the circuit board with the bonding pad free design and forms a conductive bump on an external terminal rather than the conventional bonding pad to connect with an external device with a lead or bump in a subsequent assembly process.

In FIG. 2A, external wiring 210 is formed on circuit board substrate 250. External wiring 210 comprises a plurality of trace lines 214. An external terminal 212 is usually at the end of a trace line 214 and electrically connected with an external device in the subsequent assembly process. The external device for connection to flip chip assembly substrate 200 in accordance with the first embodiment of the present invention can be an IC chip, PCB, passive device, or other device, and an IC chip 10 as shown in FIG. 3B is used in a first comparative example mentioned below. Width of external terminal 212 in accordance with the present invention is not larger than line width of trace line 214, shrinking a pitch between two neighboring trace lines 214 to be at least about 60 μm.

External wiring 210 is usually Cu and formed by, for example, attaching copper foil (not shown) to a surface of circuit board substrate 250, and etching the copper foil to form the required external wiring 210, or forming a proper mask (not shown) on a surface of circuit board substrate 250, then forming a copper layer on the exposed surface of circuit board substrate 250, using physical vapor deposition (PVD), such as sputtering, to form external wiring 210, and then removing the mask.

In FIG. 2B, first, circuit board substrate 250 and external wiring 210 are covered by solder mask 220 using screen printing or roller coating. Then, circuit board substrate 250 is pre-cured to initially harden solder mask 220. Further, solder mask 220 is patterned to form a solder mask opening 222 exposing the external terminal 212. Finally, solder mask 220 is fully hardened by a curing.

One of the functions of solder mask 220 is to protect trace line 214 from contamination resulting from contacting a solder material in a subsequent assembly process, causing a short circuit from bridging neighboring trace lines 214. Another function of solder mask 220 is to protect trace line 214 from moisture invasion when warehousing or processing the flip chip assembly substrate 200, causing a short circuit resulting from eletromigration in the trace line 214.

Solder mask opening 222, with diameter usually not less than the width of external terminal 212 includes, for example, about 1.2 to 2 times the width of external terminal 212, usually completely exposes external terminal 212.

In FIG. 2C, a conductive bump 230, rather than the conventional bonding pad, is formed on the external terminal 212 by electroless plating, in which flip chip assembly substrate 200 is immersed in an electroless plating solution (not shown) comprising compositions of conductive bump 230. Conductive bump 230 is preferably not higher than solder mask 220 to connect with an IC chip comprising a flip chip bump in the subsequent assembly process. Conductive bump 230 is usually Cu, Au coated Ni, Sn—Pb alloy, or Pb-free, Sn-based alloy.

Furthermore, circuit board substrate 250 is an unfinished laminated circuit board with a surface comprising a dielectric layer when flip chip assembly substrate 200 is a laminated circuit board having at least two wiring layers. Before forming external wiring 210 in FIG. 2A, it is necessary to form a plurality of via holes through the dielectric layer and then a metal layer includes, for example, a Cu layer, on the dielectric layer and on the surfaces of the via holes in order to electrically connect the other end of trace line 214 and laminated wiring in circuit board substrate 250 when external wiring 210 is formed.

Circuit board substrate 250 is a dielectric substrate such as a polyimide substrate when flip chip assembly substrate 200 is a one-layer circuit board. The other end of trace line 214 is usually an external terminal of another type, connecting with an external device other than that connected to external terminal 212. To finish forming conductive bump 230 shown in FIG. 2C, it is necessary to form a plurality of openings to expose the other end of trace line 214 as the external terminal of another type.

FIRST COMPARATIVE EXAMPLE

Figure 1:
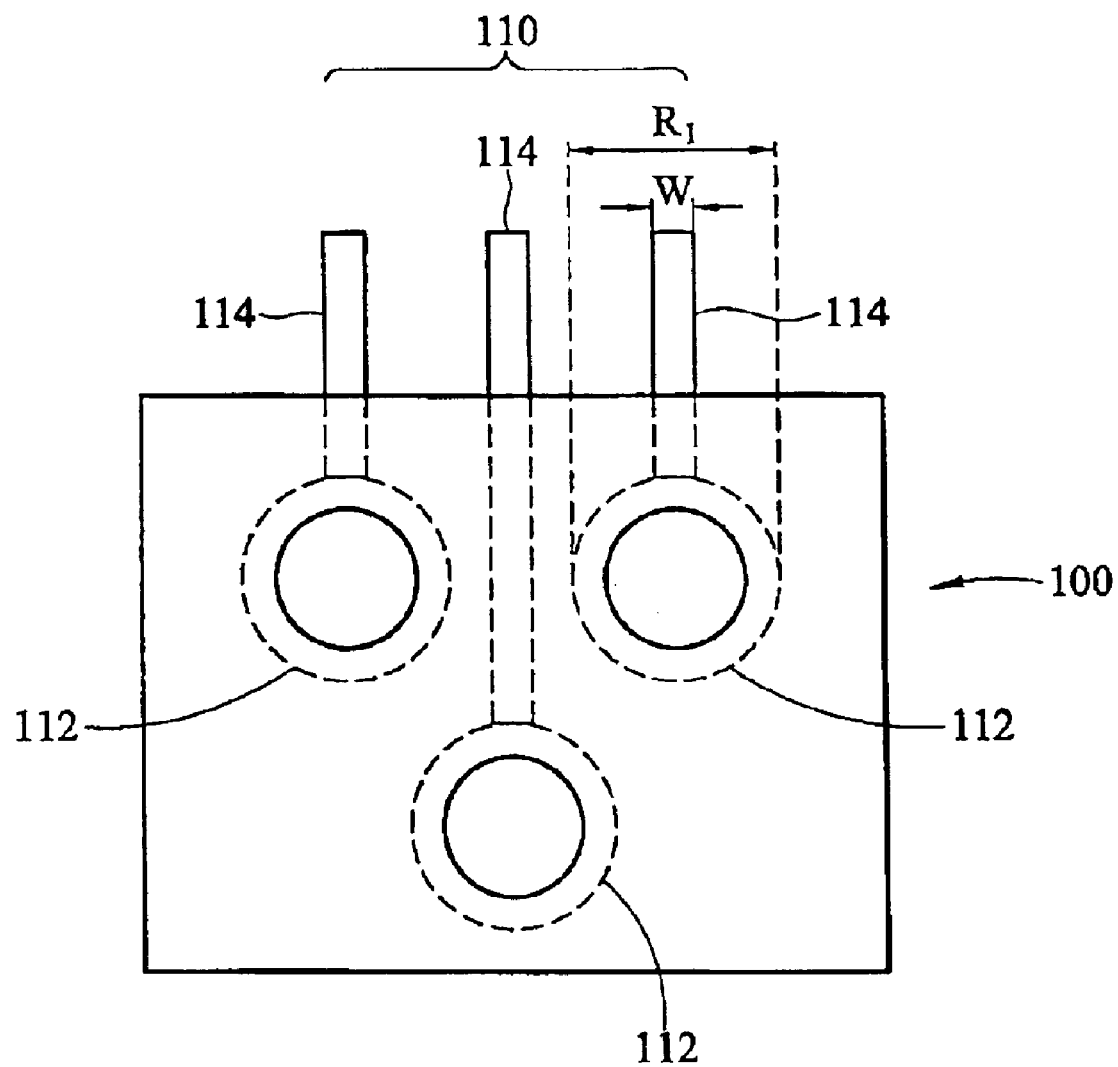
FIG. 1 is a top view illustrating a conventional flip chip assembly substrate, showing how the design rule for the external wiring terminal limits wiring density of the circuit board.
Figure 3A:
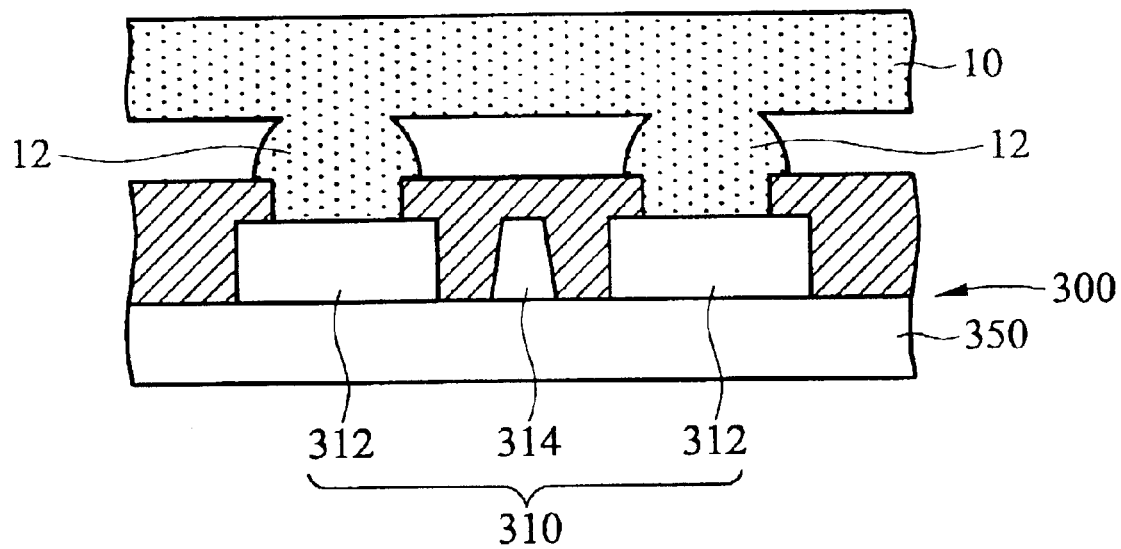
FIG. 3A and FIG. 3B are cross-sections illustrating a first comparative example of a padless high density circuit board for a conventional flip chip assembly substrate and a flip chip assembly substrate in accordance with the first embodiment of the present invention.
Figure 3B:
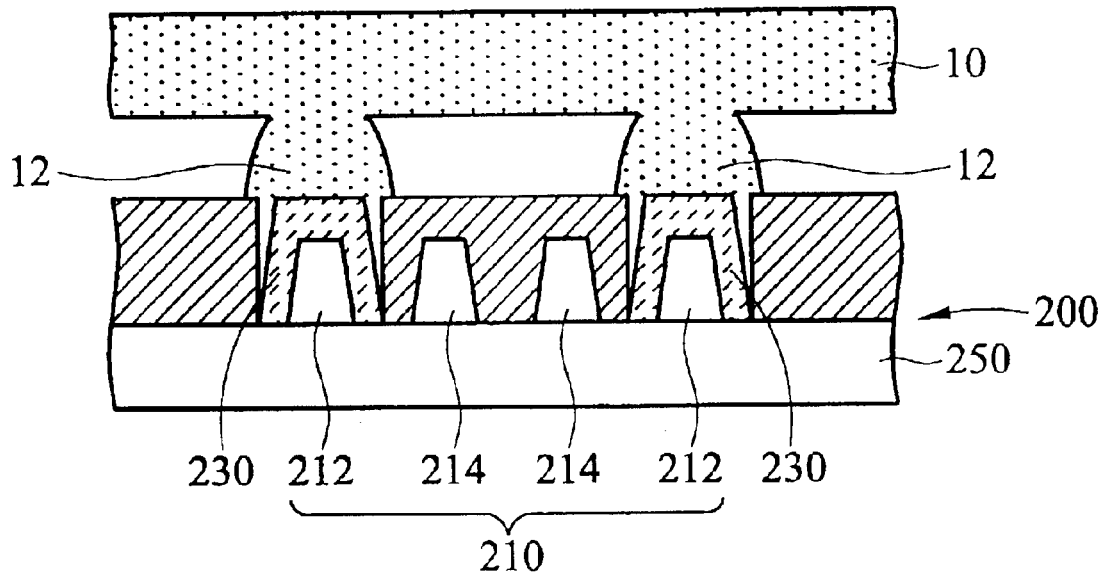

Flip chip assembly substrate 300 in FIG. 3A and flip chip assembly substrate 200 in FIG. 3B are both designed for connection with IC chip 10 with flip chip bump 12. Flip chip assembly substrate 300 is a conventional circuit board similar to that shown in FIG. 1 with a bonding pad. Flip chip assembly substrate 200 is a padless high density circuit board in accordance with the first embodiment of the present invention.

In FIG. 3A, only one trace line 314 is allowed through a pad pitch of wiring 310, in the area between two neighboring bonding pads 312, whereas in FIG. 3B, two trace lines 214 with the same line width as that of trace line 314 in FIG. 3A are allowed through terminal pitch of wiring 210, in the area between two neighboring external terminals 212, equal to that between two neighboring bonding pads 312 in FIG. 3A. Flip chip assembly substrate 200 in accordance with the first embodiment of the present invention therefore achieves higher wiring density, fewer wiring layers, and smaller area than conventional flip chip assembly substrate 300, thereby achieving the objects of the present invention.

Furthermore, in FIG. 3A, after attaching IC chip 10 to flip chip assembly substrate 300, thickness of flip chip bump 12 is decreased and width thereof is increased resulting from the wider bonding pad 312, thereby increasing possibility of a short circuit resulting from bridging the neighboring flip chip bumps 12. In the other applications of conventional circuit board includes, for example, a circuit board for connection with an IC package, light-emitting device, connector, passive device, another PCB, or other device, the short circuit such as that in flip chip assembly substrate 300 will also occur. Specifically in the application of flip chip assembly substrate 300, an underfill step, encapsulating the gap between flip chip assembly substrate 300 and IC chip 10, is performed in the subsequent assembly process. In the underfill step, the decrease in flip chip bump 12 thickness and increase in flip chip bump 12 width narrow the space, to allow an encapsulant through, thereby prolonging the processing time of the underfill step and increasing possibility of an encapsulant void, negatively affecting throughput, assembly yield, and reliability of a flip chip package using the flip chip assembly substrate 300.

Moreover, after attaching IC chip 10 to flip chip assembly substrate 200 in FIG. 3B in accordance with the padless first embodiment of the present invention, thickness and width of flip chip bump 12 are stable, resulting in reduced risk of a short circuit resulting from bridging the neighboring flip chip bumps 12. Effective applications of the inventive high density circuit board can include a circuit board for connection with an IC package, light-emitting device, connector, passive device, another PCB, or other device. Specifically in the application of flip chip assembly substrate 200, an underfill step, encapsulating the gap between flip chip assembly substrate 200 and IC chip 10, is performed in a subsequent assembly process. An additional advantage can be found in that, in the underfill step, the stability of flip chip bump 12 thickness and width offers enough space to allow an encapsulant through, thereby saving processing time of the underfill step and reducing possibility of forming an encapsulant void, negatively affecting the throughput, assembly yield, and reliability.

Second Embodiment

FIGS. 4A through 4D are cross-sections illustrating a padless high density circuit board for a flip chip assembly substrate and manufacturing steps thereof in accordance with the second embodiment of the present invention, with increased wiring density of the circuit board and a conductive bump formed on an external terminal rather than the conventional bonding pad, to connect with an external device without a lead or bump in a subsequent assembly process.

Figure 4A:
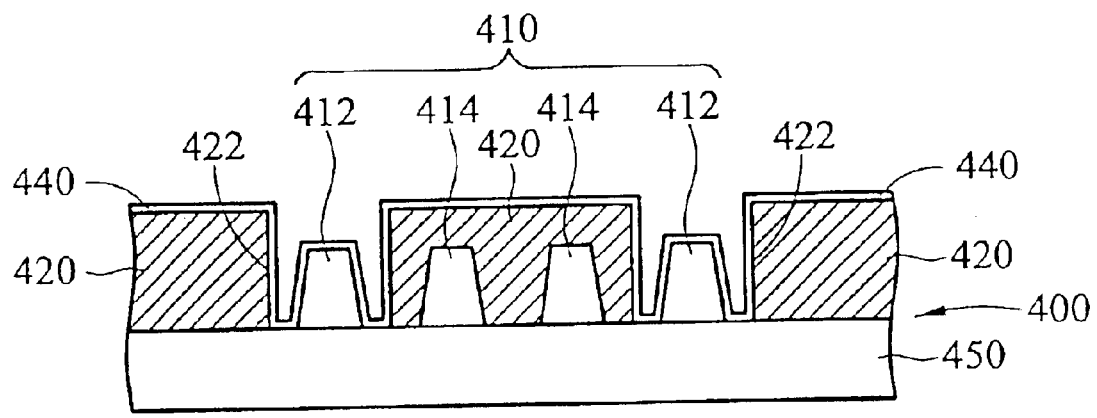
FIGS. 4A through 4D are cross-sections illustrating a padless high density circuit board for a flip chip assembly substrate and manufacturing steps thereof in accordance with the second embodiment of the present invention.

Manufacturing steps of flip chip assembly substrate 400 in FIG. 4A in accordance with the second embodiment of the present invention are the same as those of flip chip assembly substrate 200 in accordance with the first embodiment of the present invention described in FIG. 2A and FIG. 2B.

Figure 4B:
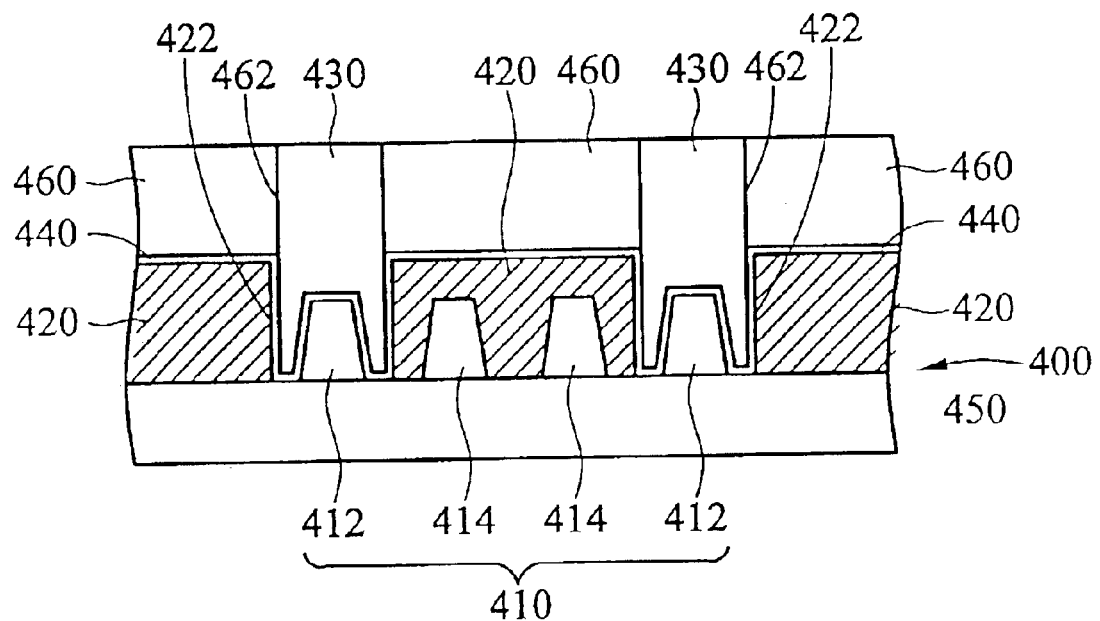
Figure 4C:
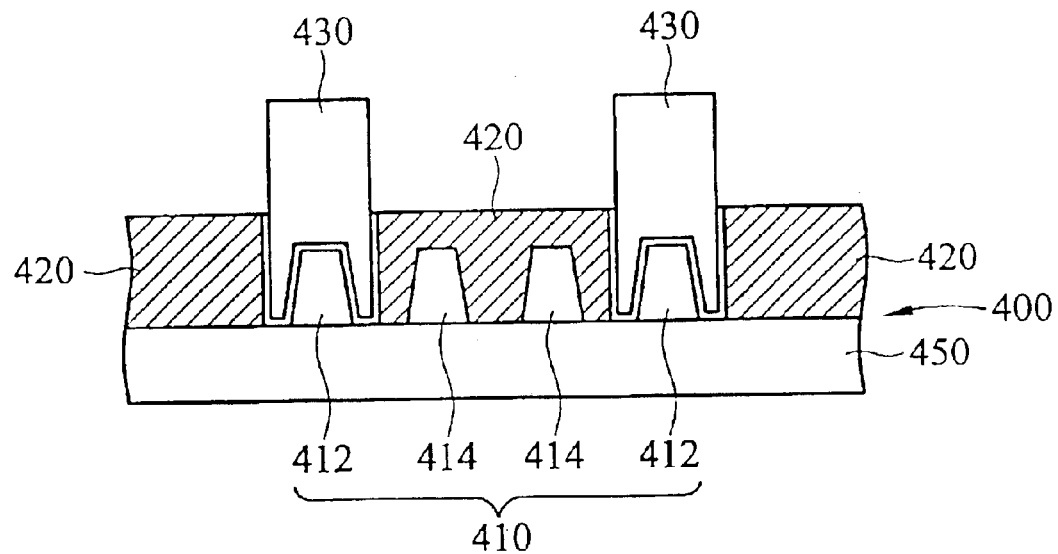

Referring to FIGS. 4A through 4C, a conductive bump 430, rather than the conventional bonding pad, is formed on an external terminal 412 by electroplating, as follows.

In FIG. 4A, a conductive metal layer 440 is formed over solder mask 420, solder mask opening 422, and external terminal 412 by PVD such as sputtering;

In FIG. 4B, after a resist layer 460 is formed over the metal layer 440, resist layer 460 is patterned to form a resist opening 462 exposing a part of metal layer 440 on the solder mask opening 422 and external terminal 412, and flip chip assembly substrate 400 is immersed in an electroplating solution (not shown) comprising the compositions of conductive bump 430 to form conductive bump 430 on external terminal 412 using metal layer 440 as an electrode.

In FIG. 4C, resist layer 460 and metal layer 440 on solder mask 420 are finally removed.

Conductive bump 430 is higher than solder mask 420, usually by about 20 μm to 60 μm, for connection with a bump-free IC chip. Conductive bump 430 is usually Cu, Au, Sn—Pb alloy, or Pb-free, Sn-based alloy.

Figure 4D:
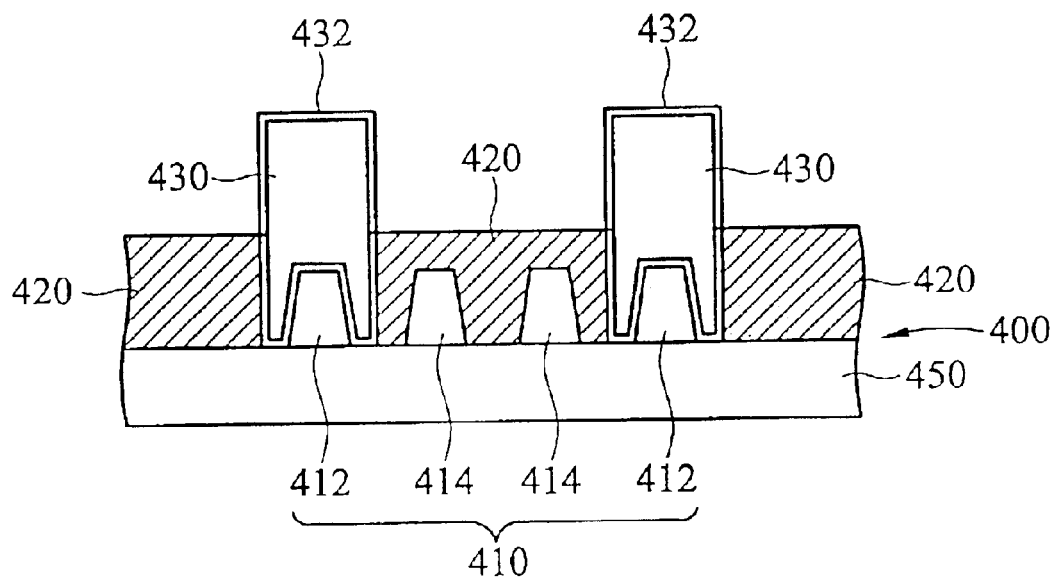

In FIG. 4D, metal layer 432 may be further formed on a surface of conductive bump 430 using hot dip, spray-on, electroplating, or other method to assist a reflow step for fixing a bump-free IC chip on flip chip assembly substrate 400 when conductive bump is Cu or Au. In hot dip, metal layer 432 is formed by immersing the conductive bump 430 in a melt of a Sn—Pb alloy or Pb-free, Sn-based alloy. Spray-on process forms metal layer 432 by spraying the melt of a Sn—Pb alloy or Pb-free, Sn-based alloy on the surface of the conductive bump 430. Metal layer 432 is formed in the same way as conductive bump 430, described in FIG. 4B when metal layer is formed by electroplating.

A conductive gel may be connect flip chip assembly substrate 400 and the bump-free IC chip when conductive bump 430 is only Cu or Au, described in the subsequent second comparative example.

Moreover, circuit board substrate 450 is an unfinished laminated circuit board with a surface comprising a dielectric layer when flip chip assembly substrate 400 is a laminated circuit board having at least two wiring layers, or a dielectric substrate when flip chip assembly substrate 400 is a one-layer circuit board. A detailed description appears in the last two paragraphs of the first embodiment.

SECOND COMPARATIVE EXAMPLE

Figure 5A:
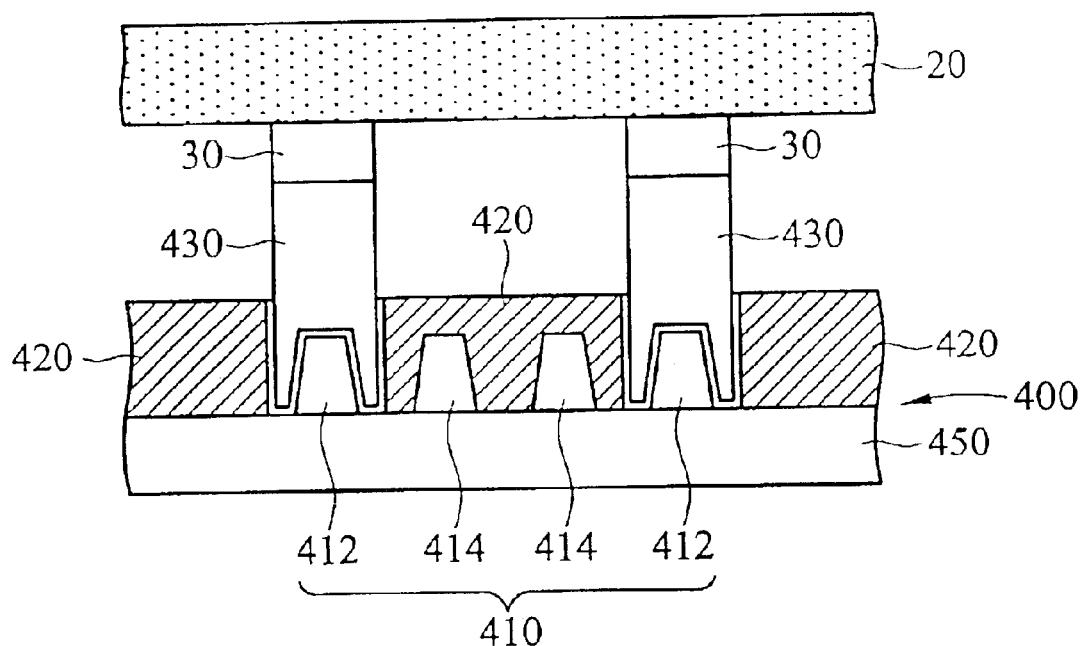
FIGS. 5A through FIGS. 5B are cross-sections illustrating a second comparative example of a padless high density circuit board for a conventional flip chip assembly substrate shown in FIG. 3A and a flip chip assembly substrate in accordance with the second embodiment of the present invention.
Figure 5B:
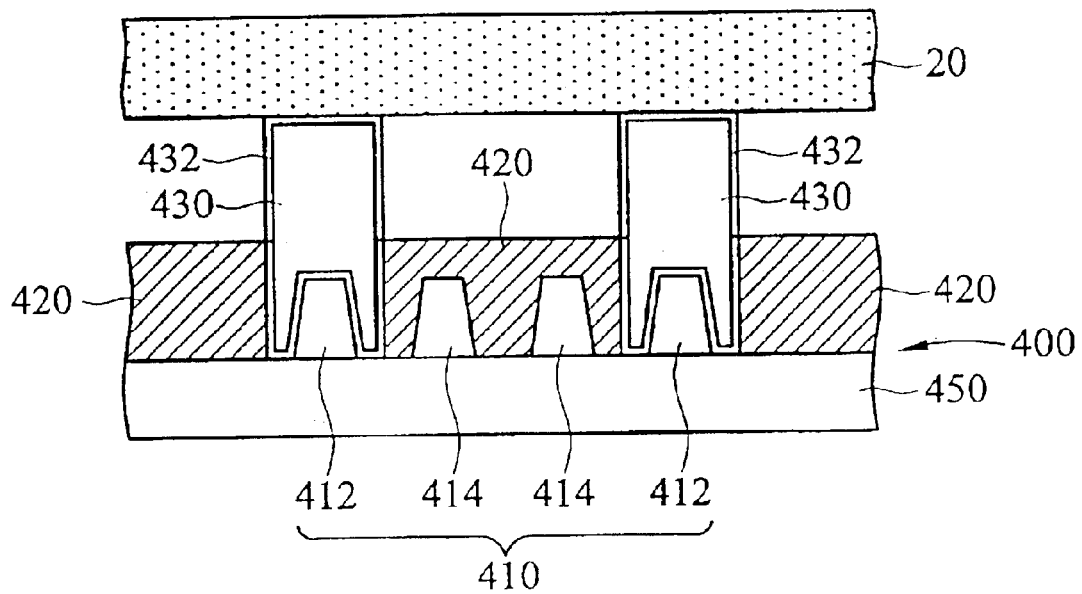

Flip chip assembly substrate 300 in FIG. 3A is designed for connection with IC chip 10 with a flip chip bump 12 and flip chip assembly substrate 400, and in FIGS. 5A through FIGS. 5c, for connection with bump-free IC chip 20. IC chip 10 and IC chip 20 have the same design and function. Flip chip assembly substrate 300 is a conventional circuit board with a bonding pad, similar to that shown in FIG. 1. Flip chip assembly substrate 400 is a padless high density circuit board in accordance with the second embodiment of the present invention.

In FIG. 3A, only one trace line 314 is allowed through a pad pitch of wiring 310, in the area between two neighboring bonding pads 312, whereas in FIGS. 5A through 5C, two trace lines 414, with the same line width as trace line 314 in FIG. 3A, are allowed through a terminal pitch of wiring 410, in the area between two neighboring external terminals 412, equal to that between two neighboring bonding pads 312 in FIG. 3A. Flip chip assembly substrate 400 in accordance with the second embodiment of the present invention is therefore with higher wiring density, fewer wiring layers, and smaller area than those of conventional flip chip assembly substrate 300, thereby achieving the objects of the present invention.

In FIGS. 5A through 5C, flip chip assembly substrate 400, in accordance with the second embodiment of the present invention, can electrically connect with IC chip 20 manufactured without a bump-forming step in a subsequent assembly process, resulting from the design of conductive bump 430 whose top is higher than solder mask 420. In other applications of the padless high density circuit board according to the present invention, an external device such as an IC package, light-emitting device, connector, passive device, another PCB, or other device, for connection with the inventive circuit board in a subsequent assembly process, can be manufactured without a lead or ball forming step such as ball placement, thereby reducing manufacturing steps, improving the throughput of the external device, resulting in further improvement of the manufacturing yield and reducing the manufacturing cost of the external device, an additional advantage of the present invention.

Furthermore, in FIG. 3A, after attaching IC chip 10 to flip chip assembly substrate 300, thickness of flip chip bump 12 is decreased and width thereof is increased, resulting from the wider bonding pad 312, thereby increasing possibility of a short circuit resulting from bridging the neighboring flip chip bumps 12. In the other applications of conventional circuit board, such as connection with an IC package, light-emitting device, connector, passive device, another PCB, or other device, the short circuit risk in flip chip assembly substrate 300 is also high. Specifically in the application of flip chip assembly substrate 300, an underfill step, encapsulating the gap between flip chip assembly substrate 300 and IC chip 10, is performed in a subsequent assembly process. In the underfill step, the decrease in flip chip bump 12 thickness and increase in flip chip bump 12 width narrow the space, allowing an encapsulant through, thereby prolonging the processing time of the underfill step and increasing possibility of an encapsulant void, negatively affecting the throughput, assembly yield, and reliability.

Moreover, after attaching IC chip 20 to flip chip assembly substrate 400 in FIGS. 5A through 5C in accordance with the first embodiment of the present invention, thickness and width of conductive bump 430 are stable, from external terminal 412 and conductive bump 430, reducing the risk of a short circuit from bridging the neighboring flip chip bumps 12. Effective application of the inventive high density circuit board includes, for example, a circuit board for connection with an IC package, light-emitting device, connector, passive device, another PCB, or other device. Specifically in the application of flip chip assembly substrate 400, an underfill step, encapsulating the gap between flip chip assembly substrate 400 and IC chip 20, is performed in a subsequent assembly process. In the underfill step, the stability of thickness and width of conductive bump 430 allows underfill through, thereby saving processing time of the underfill step and reducing possibility of forming a encapsulate void, negatively affecting the throughput, assembly yield, reliability of a flip chip package using the flip chip assembly substrate 300, another extra advantage of the padless high density circuit board according to the present invention.

Moreover, in FIG. 5A, a conductive gel 30 is formed on the conductive bump 30 by screen printing or dipping to electrically connect flip chip assembly substrate 400 and IC chip 20 without a subsequent conventional reflow step when conductive bump 430 is Cu or Au. In FIG. 5B, when conductive bump 430 is Cu or Au, a metal layer 432 is formed of Sn—Pb alloy or Pb-free, Sn-based alloy, then flip chip assembly substrate 400 is electrically connected with IC chip 20 by a reflow step. When conductive bump 430 is Sn—Pb alloy or Pb-free, Sn-based alloy, IC chip 20 is directly connected with flip chip assembly substrate 400 by a reflow step after attaching IC chip 20 to flip chip assembly substrate 400. Connecting methods of flip chip assembly substrate 400 and IC chip 20 according to conductive bump 430 are also applicable to the other applications of the padless high density circuit board according to present invention includes, for example, a circuit board for connection with an IC package, light-emitting device, connector, passive device, another PCB, or other device.

Although the present invention has been particularly shown and described above with reference to two specific embodiments, it is anticipated that alterations and modifications thereof will no doubt become apparent to those skilled in the art. It is therefore intended that the following claims be interpreted as covering all such alteration and modifications as fall within the true spirit and scope of the present invention.

What is claimed is:

1. A padless high density circuit board, comprising:
   a circuit board substrate;
   external wiring, having a plurality of trace lines, formed on the circuit board substrate, the trace line having an external terminal with a width as large as or less than trace line at the end thereof;
   a solder mask over the circuit board substrate and the external wiring with a plurality of solder mask openings exposing the external terminals, with diameters at least as large as the widths of the external terminals exposed thereby; and
   a plurality of conductive bumps formed on the external terminals exposed by the solder mask openings for connection with an external device in a subsequent assembly process.

2. The padless high density circuit board in claim 1, wherein the diameters of the solder mask openings are about 1.2 to 2 times the widths of the external terminals exposed by the solder mask openings.

3. The padless high density circuit board in claim 1, wherein line pitch of the external wiring is approximately 60 µm or more.

4. The padless high density circuit board in claim 1, wherein the circuit board substrate is an unfinished laminated circuit board or a dielectric substrate.

5. The padless high density circuit board in claim 1, wherein the external device is an IC chip.

6. The padless high density circuit board in claim 1, wherein the external device is an IC chip, IC package, light-emitting device, connector, passive device, or other PCB.

7. The padless high density circuit board in claim 1, wherein the conductive bumps are formed by electroless plating.

8. The padless high density circuit board in claim 1, wherein the conductive bumps are formed by electroplating.

9. The padless high density circuit board in claim 7, wherein the conductive bumps are Cu, Au coated Ni, Sn—Pb alloy, or Pb-free, Sn-based alloy.

10. The padless high density circuit board in claim 7, wherein the conductive bumps are not higher than the solder mask.

11. The padless high density circuit board in claim 8, wherein the conductive bumps are Cu, Sn—Pb alloy coated Cu, Pb-free, Sn-based alloy coated Cu, Au, Sn—Pb alloy coated Au, Pb-free, Sn-based alloy coated Au, Sn—Pb alloy, or Pb-free, Sn-based alloy.

12. The padless high density circuit board in claim 8, wherein the conductive bumps are about 20 µm to 60 µm higher than the solder mask.

13. A padless high density circuit board for connection with an external device with a bump or lead, comprising:
    a circuit board substrate;
    external wiring, having a plurality of trace lines, formed on the circuit board substrate, the trace line having an external terminal with a width as large as or less than the trace line at the end thereof;
    a solder mask over the circuit board substrate and the external wiring with a plurality of solder mask openings exposing the external terminals, with diameters at least as large as the widths of the external terminals exposed thereby; and
    a plurality of conductive bumps, not higher than the solder mask, formed on the external terminals exposed by the solder mask openings.

14. The padless high density circuit board in claim 13, wherein the diameters of the solder mask openings are about 1.2 to 2 times the widths of the external terminals exposed by the solder mask openings.

15. The padless high density circuit board in claim 13, wherein line pitch of the external wiring is approximately 60 µm or more.

16. The padless high density circuit board in claim 13, wherein the circuit board substrate is an unfinished laminated circuit board or a dielectric substrate.

17. The padless high density circuit board in claim 13, wherein the external device is an IC chip, IC package, light-emitting device, connector, passive device, or other PCB.

18. The padless high density circuit board in claim 13, wherein the conductive bumps are Cu, Au coated Ni, Sn—Pb alloy, or Pb-free, Sn-based alloy.

19. A padless high density circuit board for connection with an external device without a bump or lead, comprising:

a circuit board substrate;

external wiring, having a plurality of external terminals with a width as large as or less than the external wiring, formed on the circuit board substrate;

a solder mask over the circuit board substrate and the external wiring with a plurality of solder mask openings exposing the external terminals, with diameters at least as large as the widths of the external terminals exposed thereby; and a plurality of conductive bumps, about 20 $\mu$m to 60 $\mu$m higher than the solder mask, formed on the external terminals exposed by the solder mask openings.

* * * * *